(12) United States Patent
Yeh et al.

(10) Patent No.: US 6,804,137 B1
(45) Date of Patent: Oct. 12, 2004

(54) DATA STORAGE MEDIUM HAVING LAYERS ACTING AS TRANSISTOR

(75) Inventors: Bao-Sung Bruce Yeh, Corvallis, OR (US); Michael J. Regan, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/461,632

(22) Filed: Jun. 12, 2003

(51) Int. Cl.[7] .............................................. G11C 13/00
(52) U.S. Cl. ....................... 365/106; 365/113; 365/163
(58) Field of Search ................................ 365/106, 113, 365/163, 118, 115

(56) References Cited

U.S. PATENT DOCUMENTS

| | | | |
|---|---|---|---|
| 5,038,321 A | * 8/1991 | Van Zeghbroeck | ......... 365/106 |
| 5,557,596 A | 9/1996 | Gibson et al. | |
| 6,066,381 A | 5/2000 | Cho et al. | |
| 6,087,674 A | 7/2000 | Ovshinsky et al. | |
| 6,236,589 B1 | 5/2001 | Gupta et al. | |
| 6,243,348 B1 | 6/2001 | Goodberlet | |
| 6,274,463 B1 | 8/2001 | Chaiken | |
| 6,275,410 B1 | 8/2001 | Morford | |

* cited by examiner

*Primary Examiner*—David Lam

(57) ABSTRACT

A re-recordable data storage medium of one embodiment includes a substrate layer, a phase-changeable layer, and an intermediate layer. The substrate layer has a semiconductor type selected from p-type and n-type. The phase-changeable layer has a first phase corresponding to a first storable logical value, and a second phase corresponding to a second storable logical value. The phase-changeable layer has a semiconductor type identical to that of the substrate layer. The intermediate layer is between the phase-changeable layer and the substrate layer, and has a semiconductor type opposite to that of the phase-changeable and substrate layer. The substrate, phase-changeable, and intermediate layers act as a transistor under selective illumination of the phase-changeable layer.

53 Claims, 5 Drawing Sheets

DATA STORAGE MEDIUM HAVING LAYERS ACTING AS TRANSISTOR

BACKGROUND OF THE INVENTION

Storage media for computers and other types of electronic devices generally come in two types: volatile memory and non-volatile memory. Volatile memory loses its contents when power is no longer being supplied to the memory, whereas non-volatile memory maintains its contents even when power is not being supplied to the memory. The most common type of volatile memory is random-access memory (RAM), which is most commonly available as and implemented as an integrated circuit (IC). The term data storage medium is used herein in a broad sense, and encompasses IC memory, as well as other types of data storage media.

By comparison, non-volatile memory has perhaps more commonly been available as and implemented as magnetic and optical media, including hard disk drives, floppy disks, compact disc read-only memories (CD-ROM's), CD re-writable (CD-RW) discs, and digital versatile discs (DVD's), among others. Historically, non-volatile memory implemented as an IC was primarily available as ROM that were not re-recordable, such as hard-wired ROM and programmable ROM (PROM). More recently, IC non-volatile memory has become available as various types of flash memory, which is more technically known as electrically erasable PROM (EEPROM).

IC-based data storage media is typically read from and, where applicable, written to, by directly using electric signals. By comparison, magnetic and optical data storage media is typically read from, and where applicable, written, to using magnetic sensors and optical sensors, where the latter usually include some type of illuminating beam. However, U.S. Pat. No. 5,557,596 describes a data storage medium that can be implemented as an IC, but that is read from and written to using an illuminating beam. A phase-changeable layer is present that can be switched between two different phases by being subjected to the illuminating beam. The two phases correspond to different logical values, such as binary one and binary zero.

For reading the logical value stored in the phase-changeable layer, the medium is subjected to the illuminating beam at a low intensity. This induces current within the medium, which is then detected and correlated with the current phase of the re-recordable storage medium to determine the logical value stored in the medium. However, the current is relatively small, making it difficult to detect without error. Any present noise risks masking the current, as well as any material imperfections in the medium, which can cause erroneous logical values being read, affecting the accuracy of the medium as a data storage device.

For this and other reasons, therefore, there is a need for the present invention.

SUMMARY OF THE INVENTION

A re-recordable data storage medium of one embodiment includes a substrate layer, a phase-changeable layer, and an intermediate layer. The substrate layer has a semiconductor type selected from p-type and n-type. The phase-changeable layer has a first phase corresponding to a first storable logical value, and a second phase corresponding to a second storable logical value. The phase-changeable layer has a semiconductor type identical to that of the substrate layer. The intermediate layer is between the phase-changeable layer and the substrate layer, and has a semiconductor type opposite to that of the phase-changeable and substrate layer. The substrate, phase-changeable, and intermediate layers act as a transistor under selective illumination of the phase-changeable layer.

BRIEF DESCRIPTION OF THE DRAWINGS

The drawings referenced herein form a part of the specification. Features shown in the drawing are meant as illustrative of only some embodiments of the invention, and not of all embodiments of the invention, unless otherwise explicitly indicated, and implications to the contrary are otherwise not to be made.

DETAILED DESCRIPTION OF THE INVENTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Re-Recordable Data Storage Medium

Figure 1:
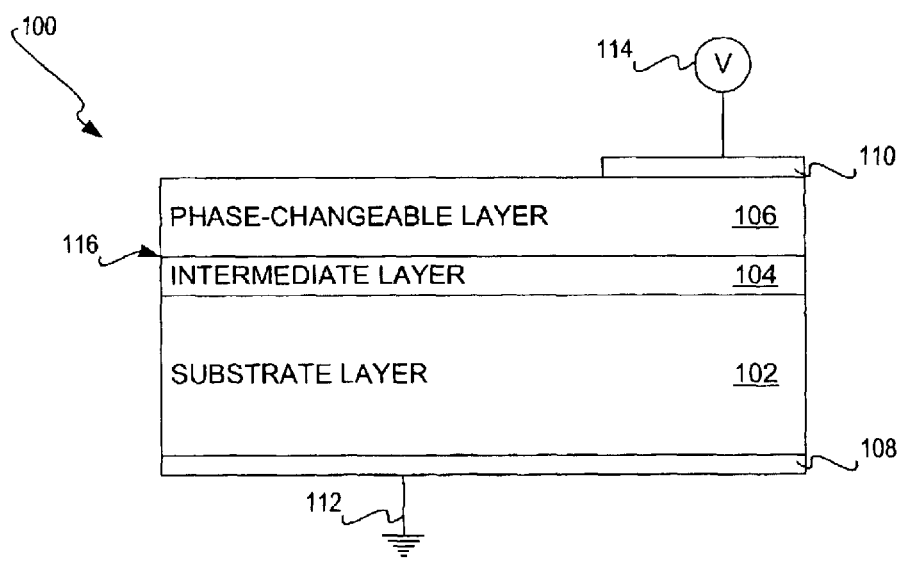
FIG. 1 is a diagram of a re-recordable data storage medium, according to an embodiment of the invention.

FIG. 1 shows a re-recordable data storage medium 100 according to an embodiment of the invention. The medium 100 includes a bottom electrode 108, a substrate layer 102, an intermediate layer 104, a phase-changeable layer 106, and a top electrode 110. The medium 100 may be an electronic device, such as an integrated circuit (IC). The bottom electrode 108 at least substantially spans completely under the substrate layer 102, whereas the top electrode 110 only partially spans over the phase-changeable layer 106. The bottom electrode 108 is preferably connected to ground 112, whereas the top electrode 110 is preferably connected to a voltage source 114.

The phase-changeable layer 106 is the layer in which a logical value can be stored as data. Preferably, the layer 106 has at least two phases. One phase corresponds to the layer 106 being crystalline, whereas another phase corresponds to the layer 106 being amorphous, or a different type of crystalline state. When the medium 100 is locally subjected to a sufficiently intense illuminating beam with the appropriate pulse shape, such as an electron beam (e-beam) or a laser beam, the local phase of the layer 106 changes, indicating a change to the logical value stored at that position within the layer 106. For instance, one phase may correspond to a logical zero value, whereas the other phase may correspond to a logical one value.

Similarly, to read the logical value stored as data as the phase of the phase-changeable layer 106, an illuminating beam is emitted on the re-recordable data storage medium 100. This can be the same beam as the beam used for writing, but the intensity is lower for reading the value stored within the layer 106 than it is for changing the value stored within the layer 106, so as to not to induce changes in the stored data. The illuminating beam induces a current through the medium 100, which is subsequently detected and compared to two reference currents, one for each logical value that can be stored by the layer 106. That is, the current through the medium 100 varies depending on the local phase of the layer 106 in the interrogated region. In this manner, the value stored within in the interrogated region of the layer 106 is determined.

Preferably, the substrate layer 102 and the phase-changeable layer 106 are of one semiconductor type, whereas the intermediate layer 104 is of the opposite semiconductor type. For instance, both the materials 102 and 106 may be n-type, as known within the art, whereas the intermediate layer 104 may be p-type, as also known within the art. As a result, the intermediate layer 104 and the phase-changeable layer 106 form a heterojunction 116 therebetween. By comparison, if the intermediate layer 104 and the substrate layer 102 were of the same semiconductor type, the heterojunction 116 would not be formed, and instead a homojunction would be formed.

Figure 2:
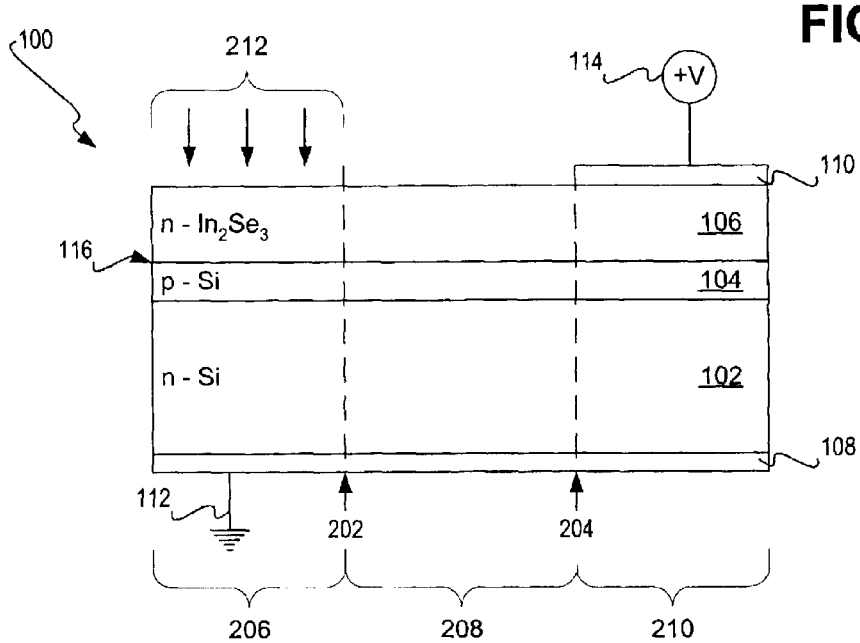
FIG. 2 is a diagram showing in more detail a re-recordable data storage medium, according to an embodiment of the invention.

FIG. 2 shows the re-recordable data storage medium 100 in more detail, according to an embodiment of the invention. The phase-changeable layer 106 is indicated as an n-type indium selenide layer, the intermediate layer 104 is indicated as a p-type silicon layer, and the substrate layer 102 is indicated as an n-type silicon layer. As shown in FIG. 2, the layers 102, 104, and 106 are divided into parts 206, 208, and 210 by the dotted lines 202 and 204. This is not a physical division, but rather a logical division according to its functionality, except that the top electrode 110 spans over only the part 210 of the phase-changeable layer 106. Preferably each part 206, 208, and 210 of one or more of the layers 102, 104, and 106 function differently when the part 206 of the phase-changeable layer 106 is subject to the illuminating beam 212.

The medium 100 of the embodiment of FIG. 2 operates as follows for reading the logical data value stored in the phase-changeable layer 106. The voltage source 114 positively biases the top electrode 110. The part 206 of the phase-changeable layer 106 is subject to the illuminating beam 212. This illumination generates electron-hole carrier pairs into the medium 100. The hole carriers collect in the intermediate layer 104. Current flows through the medium 100, and is particularly detected at the top electrode 110.

Circuit Function Block Modeling

Figure 3:
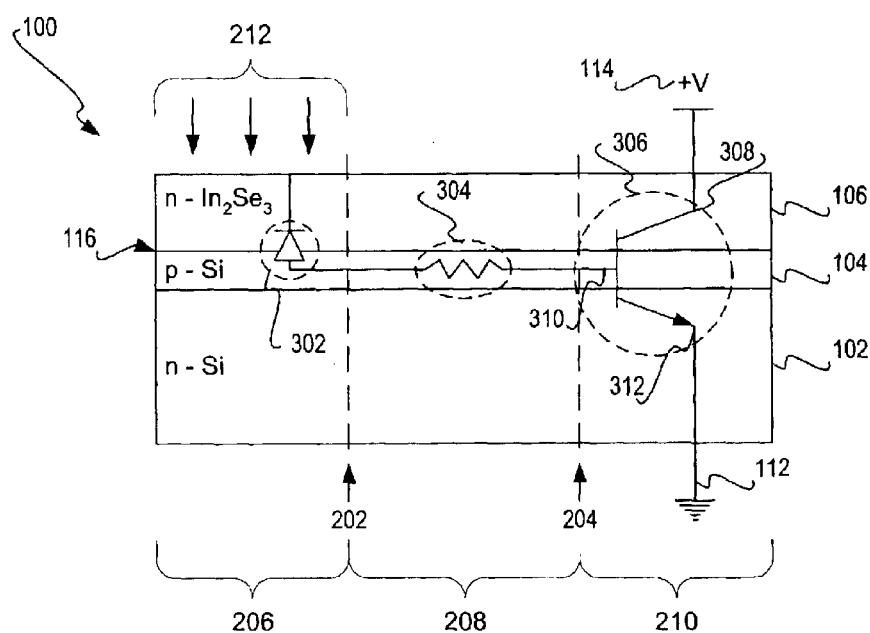
FIG. 3 is a diagrams showing how a re-recordable data storage medium can be modeled as a circuit, according to an embodiment of the invention.

FIG. 3 shows how the re-recordable data storage medium 100 behaves as a circuit block, composing of a transistor 306, as well as a diode 302 and a resistor 304, according to an embodiment of the invention. That is, FIG. 3 shows how the different parts 206, 208, and 210 of one or more of the layers 102, 104, and 106 function differently in one embodiment of the invention. The parts 206 of the phase-changeable layer 106 and the intermediate layer 104 act as the diode 302, whereas the part 208 of the intermediate layer 104 acts as the resistor 304. The parts 210 of the layers 102, 104, and 106 act as the transistor 306.

The transistor 306 includes a collector 308, a base 310, and an emitter 312, corresponding to the part of the phase-changeable layer 106, the intermediate layer 104, and the substrate layer 102, respectively. When the carrier pairs are injected into the part 206 of the phase-changeable layer 106 resulting from the part 206 of the layer 106 being subjected to the illuminating beam 212, the hole carriers travel through the diode 302 and through the resistor 304. The hole carriers are thus collected in the intermediate layer 104, turning on the transistor 306. Because the collector 308 of the transistor 306 is biased by the voltage source 114, electrons can flow to the collector 308, and are detected at the top electrode 110 (not shown in FIG. 3).

Thus, the beam 212 generates a cathodo-voltaic potential across the junction 116. This potential provides a bias to the intermediate layer 104 to assist hole carriers propagating along the intermediate layer 104. This also lowers the conduction band barrier of the part 206 of the intermediate layer 104, helping to conduct electron carriers between the phase-changeable layer 106 and the intermediate layer 104 on part 206. The hole current generated from the cathodo diode 302 travels through the resistor 304 and becomes the base current of the transistor 306, which turns on the transistor 306. Because of the positive bias provided by the voltage source 114, the phase-changeable layer 106 is used as the collector 308 of the transistor 306, such that the transistor 306 operates in a reversed bias configuration. The current through the voltage source and thus the collector of the transistor 306 thus follows the hole base current.

Representative Re-Recordable Data Storage Medium

Figure 4:
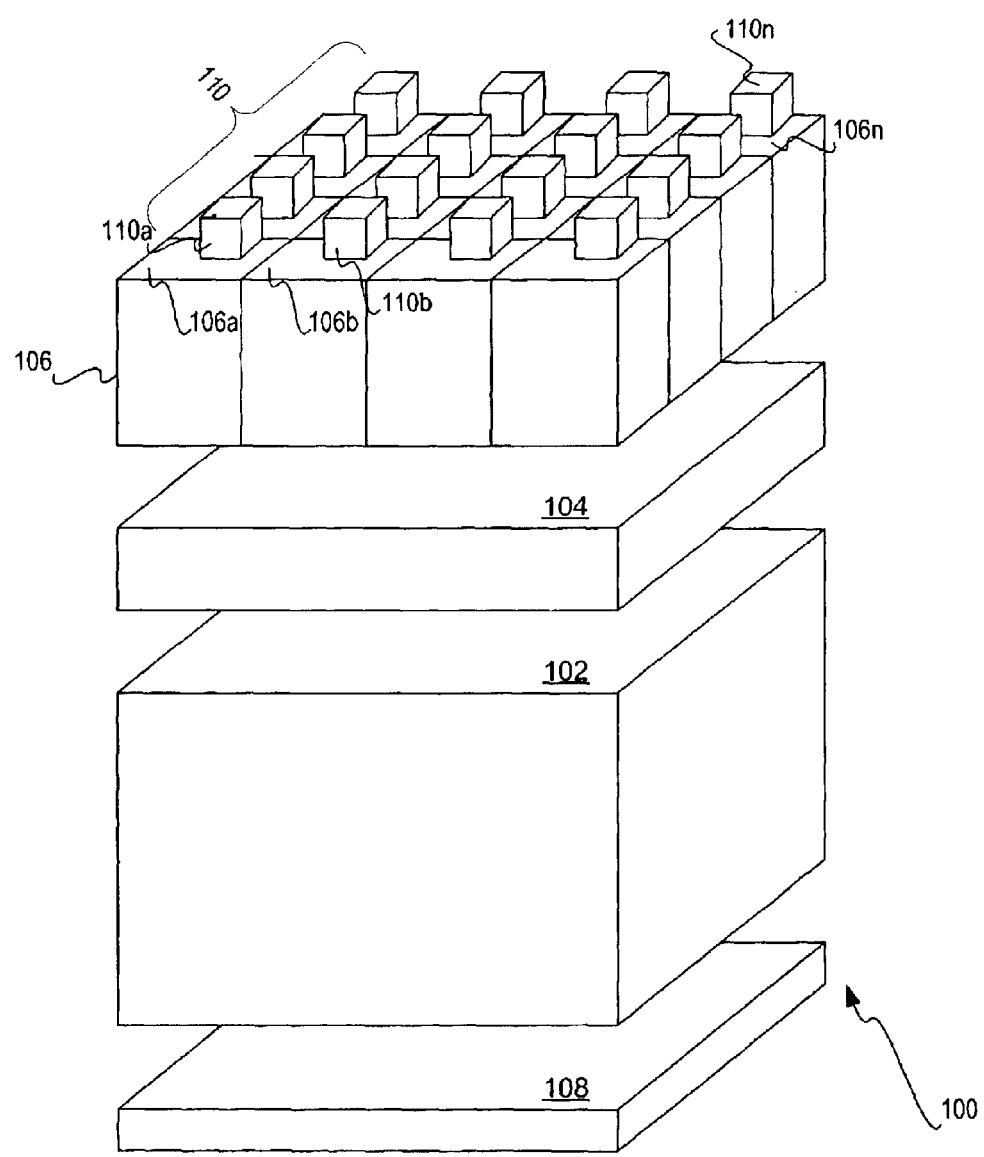
FIG. 4 is a diagram of an exploded perspective view of a representative re-recordable data storage medium, according to an embodiment of the invention.

The re-recordable data storage medium 100 as has been shown and described thus far is a single memory cell device, able to store a single logical value. However, that representation of the medium 100 is for illustrative clarity and is not an indication of the number of data values that the medium 100 would likely store in actuality. Therefore, FIG. 4 shows an exploded perspective of the medium 100 according to an embodiment of the invention in which many different data values can be stored. The medium 100 still includes the substrate layer 102, the intermediate layer 104, the phase-changeable layer 106, the bottom contact 108, and the top contact 110.

However, the phase-changeable layer 106 has been divided over two dimensions into a number of sub-portions 106a, 106b, ..., 106n, each of which extends from the top surface of the layer 106 to the bottom surface of the layer 106. Each sub-portion of the layer 106 corresponds to a number of memory cells that can have independently modified phases. Thus, each sub-portion of the layer 106 stores a corresponding number of independently modified logical values.

Similarly, the top electrode 110 has been divided over two dimensions into a number of sub-portions 110a, 110b, ... 110n. Each sub-portion of the top electrode 110 corresponds to a sub-portion of the phase-changeable layer 106. Furthermore, each subportion of the top electrode 110 is preferably electrically discontinuous with the other sub-portions of the top contacts 110. That is, in a preferred embodiment of the invention, each sub-portion of the top electrode 110 does not make electrical contact with the other sub-portions of the top contacts 110.

Method of Using

Figure 5:
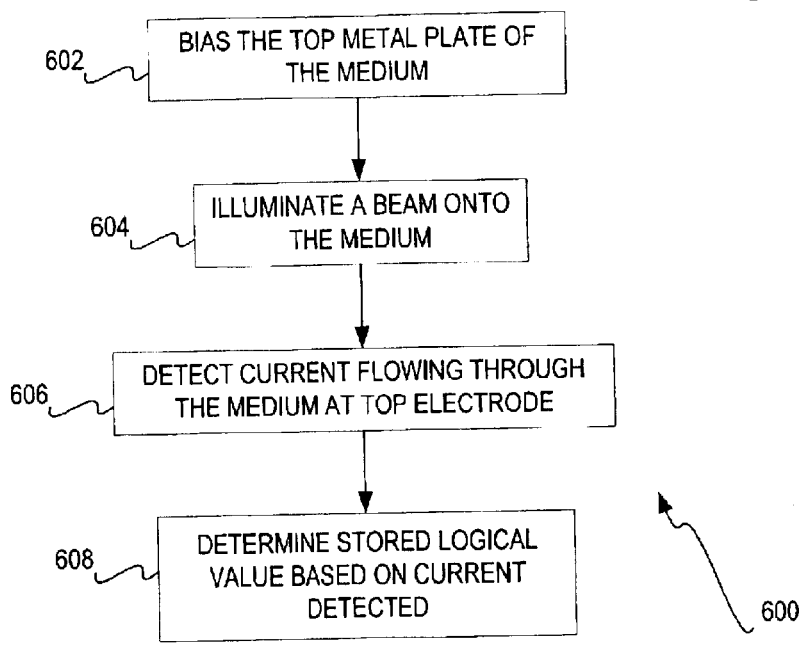
FIG. 5 is a flowchart of a method for reading the logical value currently stored as data by a re-recordable data storage medium, according to an embodiment of the invention.

FIG. 5 shows a method 600 for using the re-recordable data storage medium 100, according to an embodiment of the invention. First, the top contact 110 is biased with a voltage (602), such as by using the voltage source 114. The voltage preferably is opposite to the type of the phase-changeable layer 106 and the type of the substrate layer 102. Where the layers 102 and 106 are n-type, for example, this voltage is usually positive, and where the layers 102 and 106 are p-type, the voltage is typically negative.

A beam is then used to illuminate the medium 100 (604). The beam may be an e-beam, a laser beam, or another type of beam capable of generating electron-hole pairs in the medium 100. As has been described, this electron-hole pair generation causes carriers to collect within the intermediate layer 104, lowering the conduction barrier, and allowing current. The current turns on the transistor 306, allowing current to flow at the collector 308 of the transistor 306. This current is then detected at the top electrode (606).

The logical value stored within the phase-changeable layer 106 is finally determined based on the current flowing through the medium 100 that has been detected (608). As has been described, the current differs depending on the phase of the phase-changeable layer 106. Because the logical value stored within the layer 106 corresponds to the phase of the layer 106, determining the current flowing through the medium 100 allows the logical value stored within the layer 106 to also be determined.

Method of Manufacture

Figure 6:
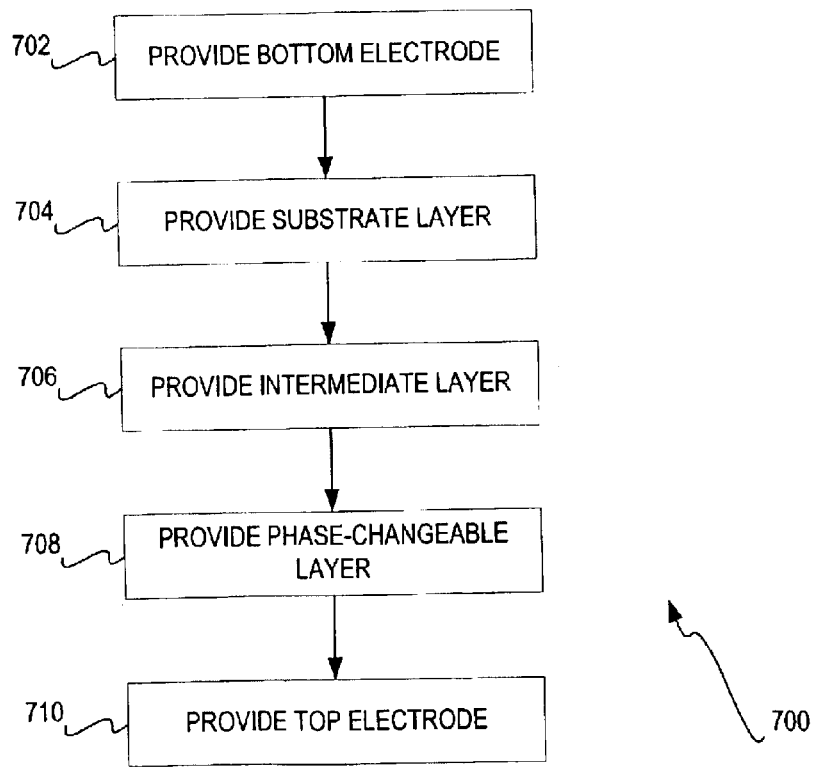
FIG. 6 is a flowchart of a method for constructing a re-recordable data storage medium, according to an embodiment of the invention.

FIG. 6 shows a method 700 for manufacturing the rerecordable data storage medium 100, according to an embodiment of the invention. That is, the medium 100 can be constructed by performing the method 700. The method 700 may be performed as a semiconductor fabrication process, to result in the medium 100 being an IC, as can be appreciated by those of ordinary skill within the art. First, the bottom electrode 108 is provided (702). The contact 108 may be provided by depositing metal, for instance, or be appropriately doping a semiconducting substrate. Next, the substrate layer 102 is provided on the bottom electrode 108 (704). In one embodiment, 702 and 704 are performed in reverse order. The substrate layer 102 is the substrate of a silicon wafer, which is doped according to its type. The bottom contact 108 can then be formed on the backside or top portion of the wafer.

The intermediate layer 104 is provided on the substrate layer 102 (706). The intermediate layer 104 may be provided by ion implanting and/or epitaxially growing additional silicon on the substrate layer 102, and then doping the silicon with its specified type, opposite to the type of the substrate layer 102. The phase-changeable layer is subsequently provided on the intermediate layer (708), such as by depositing and doping a film of indium selenide, and optionally patterned. Finally the top contact plate is provided (710), such as by depositing and optionally patterning metal.

Mass Storage Device

Figure 7:
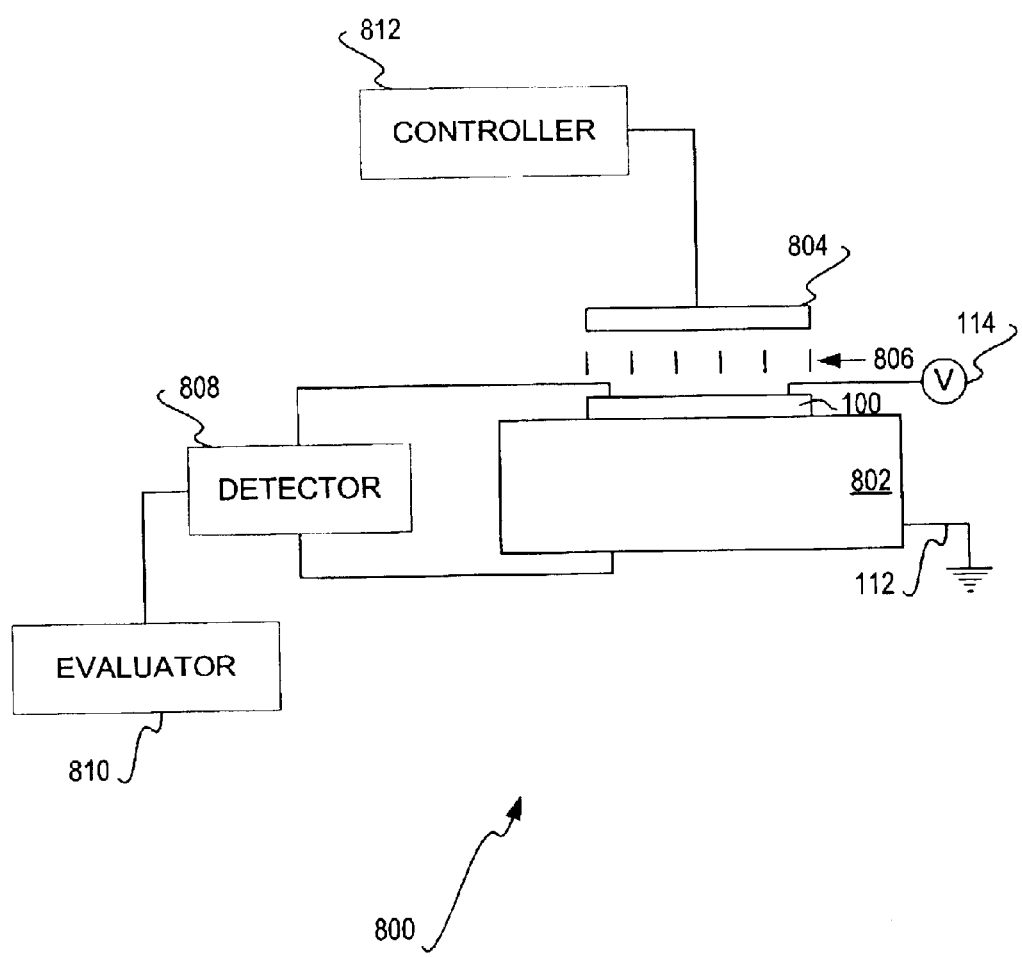
FIG. 7 is a diagram of a mass storage device, according to an embodiment of the invention.

FIG. 7 shows a diagram of a rudimentary mass storage device 800 that can be used to read data from and write data to the re-recordable data storage medium 100, according to an embodiment of the invention. The storage medium 100 specifically can be the embodiment of FIG. 4, where the medium 100 has a number of sub-portions that each can store its own data. The storage medium 100 is placed on a block 802 that is grounded to the ground 112. More generally, the block 802 is an instance of a mechanism that is receptive to the storage medium 100. The voltage source 114 is connected to the storage medium 100 as well. Thus, the bottom surface of the medium 100 is grounded, whereas the top surface of the medium 100 is biased.

An array of beam generators 804 corresponding to the sub-portions of the storage medium 100 is positioned over the medium 100, where preferably each beam generator corresponds to its own sub-portion of the medium 100. The array of beam generators 804 may be an electron field emitter array, or another type of array, of beam generators. A controller 812 is able to selectively turn on and off individual beams of the array 804, at varying desired intensities. The detector 808 is able to detect the current flowing through the storage medium 100, if any, whereas the evaluator 810 correlates the current detected with reference current levels to determine the logical value being stored in a given sub-portion of the medium 100.

Operation of the mass storage device 800 is as follows. To change the value stored by a sub-portion of the medium 100, the controller 812 turns on the corresponding beam generator to generate a beam 806, at an intensity and time profile, or pulse shape, sufficient to change the phase of the phase-changeable layer of the sub-portion. To read the value stored by a sub-portion of the medium 100, the controller 812 again turns on the corresponding beam generator, but at a lower intensity level. The resulting beam 806 induces current within the medium 100 that is detected by the detector 808. The current induced depends on the phase of the phase-changeable layer of the sub portion, and thus on the logical value stored in the sub-portion. The evaluator 810 correlates the detected current with this logical value.

Conclusion

It is noted that, although specific embodiments have been illustrated and described herein, it will be appreciated by those of ordinary skill in the art that any arrangement is calculated to achieve the same purpose may be substituted for the specific embodiments shown. This application is intended to cover any adaptations or variations of the present invention. Therefore, it is manifestly intended that this invention be limited only by the claims and equivalents thereof.

What is claimed is:

1. A re-recordable data storage medium comprising:
   a substrate layer having a semiconductor type selected from p-type and n-type;
   a phase-changeable layer having a first phase corresponding to a first storable logical value and a second phase corresponding to a second storable logical value, the phase-changeable layer having a semiconductor type identical to the semiconductor type of the substrate layer; and,
   an intermediate layer between the phase-changeable layer and the substrate layer having a semiconductor type opposite to the semiconductor type of the phase-changeable layer and the substrate layer,
   the substrate layer, the phase-changeable layer, and the intermediate layer acting as a transistor under selective illumination of the phase-changeable layer.

2. The medium of claim 1, further comprising a top electrode partially spanning over the phase-changeable layer and connectable to a voltage source.

3. The medium of claim 2, wherein the semiconductor type of the phase-changeable layer and the semiconductor type of the substrate layer is n-type, and the semiconductor type of the intermediate layer is p-type, the voltage source providing a positive voltage.

4. The medium of claim 2, wherein selectively illuminating the phase-changeable layer causes current to flow at the top electrode.

5. The medium of claim 1, further comprising a bottom electrode coupled to the substrate layer and connectable to ground.

6. The medium of claim 1, wherein the substrate layer acts as an emitter of the transistor, the phase-changeable layer acts as a collector of the transistor, and the intermediate layer acts as a base of the transistor.

7. The medium of claim 1, wherein the phase-changeable layer and the intermediate layer further act as a diode under selective illumination of the phase-changeable layer.

8. The medium of claim 1, wherein the intermediate layer further acts as an active resistor.

9. A re-recordable data storage medium comprising:
- a substrate layer having a semiconductor type selected from p-type and n-type;
- a phase-changeable layer having a first phase corresponding to a first storable logical value and a second phase corresponding to a second storable logical value, the layer having a semiconductor type identical to the semiconductor type of the substrate layer, the layer divided into at least two parts including a first part subjectable to illumination;
- an intermediate layer between the phase-changeable layer and the substrate layer having a semiconductor type opposite to the semiconductor type of the phase-changeable layer and the substrate layer;
- a top electrode spanning over a second part of the phase-changeable layer; and,
- a bottom electrode coupled to the substrate layer.

10. The medium of claim 9, wherein the semiconductor type of the phase-changeable layer and the semiconductor type of the substrate layer is n-type, and the semiconductor type of the intermediate layer is p-type.

11. The medium of claim 9, wherein the top electrode is coupled to a voltage source and the bottom electrode is coupled to ground.

12. The medium of claim 11, wherein the voltage source provides a positive voltage.

13. The medium of claim 9, wherein subjecting the first part of the phase-changeable layer to illumination causes current to flow at the top electrode.

14. The medium of claim 9, wherein the phase-changeable layer, the substrate layer, and the intermediate layer act as a transistor having a collector, an emitter, and a base, the second part of the phase-changeable layer acting as the collector, a part of the substrate layer corresponding to the second part of the phase-changeable layer acting as the base, and a part of the intermediate layer corresponding to the second part of the phase-changeable layer acting as the emitter.

15. The medium of claim 14, wherein carriers injected by illumination of the first part of the phase-changeable layer collect at the part of the intermediate layer, turning on the transistor and causing current to flow through the second part of the phase-changeable layer to the top electrode.

16. The medium of claim 9, wherein the at least two parts of the phase-changeable layer includes a third part between the first part subjectable to illumination and the second part over which the top electrode spans, a part of the intermediate layer corresponding to the third part of the phase-changeable layer acting as an active resistor.

17. The medium of claim 9, wherein a part of the intermediate layer corresponding to the first part of the phase-changeable layer and the first part of the phase-changeable layer act as a diode.

18. The medium of claim 9, wherein the phase-changeable layer and the intermediate layer define a heterojunction therebetween.

19. The medium of claim 9, wherein at least one of the substrate layer and the intermediate layer is a silicon layer.

20. The medium of claim 9, wherein the phase-changeable layer is an indium selenide layer.

21. The medium of claim 9, wherein the first phase corresponds to the phase-changeable layer being crystalline, and the second phase corresponds to the phase-changeable layer being amorphous.

22. The medium of claim 9, wherein the medium is at least one of an electronic device and an integrated circuit (IC).

23. A re-recordable data storage medium comprising:
- a substrate layer having a semiconductor type selected from p-type and n-type;
- a phase-changeable layer having a first phase corresponding to a first storable logical value and a second phase corresponding to a second storable logical value, the layer having a semiconductor type identical to the semiconductor type of the substrate layer; and,
- an intermediate layer vertically between the phase-changeable layer and the substrate layer having a semiconductor type opposite to the semiconductor type of the phase-changeable layer and the substrate layer,
- the substrate layer, the phase-changeable layer, and the intermediate layer divided horizontally into a plurality of parts, each part operating differently when the medium is illuminated.

24. The medium of claim 23, further comprising a top electrode spanning over a part of the phase-changeable layer and connectable to a voltage source.

25. The medium of claim 23, further comprising a bottom electrode spanning under the plurality of parts of the substrate layer and connectable to ground.

26. The medium of claim 23, wherein a part of the substrate layer, the phase-changeable layer, and the intermediate layer acts as a transistor having a collector, an emitter, and a base.

27. The medium of claim 26, wherein the part of the substrate layer acts as the emitter, the part of the phase-changeable layer acts as the collector, and the part of the intermediate layer acts as the base.

28. The medium of claim 23, wherein a part of the intermediate layer acts as an active resistor.

29. The medium of claim 23, wherein a part of the phase-changeable layer and a part of the intermediate layer act as a diode under medium illumination.

30. A re-recordable data storage medium comprising:
- a substrate layer having a semiconductor type selected from p-type and n-type;
- a phase-changeable layer having a plurality of subportions, each sub-portion having a first phase corresponding to a first storable logical value and a second phase corresponding to a second storable logical value, the layer having a semiconductor type identical to the semiconductor type of the substrate layer;
- an intermediate layer between the phase-changeable layer and the substrate layer having a semiconductor type opposite to the semiconductor type of the phase-changeable layer and the substrate layer;
- for each sub-portion of the phase-changeable layer, a top electrode partially spanning over the sub-portion and connectable to a voltage source; and,
- a bottom electrode coupled to the substrate layer and connectable to ground,
- wherein selectively illuminating a subportion of the phase-changeable layer causes current to flow at the top electrode for the sub-portion.

31. The medium of claim 30, wherein at least one of the substrate layer and the intermediate layer is a silicon layer.

32. The medium of claim 30, wherein the phase-changeable layer is an indium selenide layer.

33. A re-recordable data storage medium comprising:
a substrate layer;
a phase-changeable layer capable of repeatedly storing a data value selected from a first logical value and a second logical value; and,
means for interacting with the substrate layer and the phase-changeable layer to form a transistor by which current representative of the data value stored by the phase-changeable layer is output upon medium illumination.

34. The medium of claim 33, further comprising a top electrode partially spanning over the phase-changeable layer and a bottom electrode coupled to the substrate layer.

35. The medium of claim 34, wherein the top electrode is connected to a voltage source and the bottom electrode is grounded.

36. The medium of claim 33, the substrate layer acting as an emitter of the transistor, the phase-changeable layer acting as a collector of the transistor, and the means for interacting acting as a base of the transistor.

37. A method comprising:
providing a first silicon layer of a re-recordable data storage medium having a semiconductor type selected from p-type and n-type;
providing a second silicon layer over the first silicon layer having a semiconductor type opposite to the semiconductor type of the first silicon layer;
providing a phase-changeable layer over the second silicon layer having a crystalline phase corresponding to a first storable logical value and an amorphous phase corresponding to a second storable logical value, the layer having a semiconductor type identical to the semiconductor type of the first silicon layer; and,
providing a top electrode partially over the phase-changeable layer and connectable to a voltage source.

38. The method of claim 37, further initially comprising providing a bottom electrode on which the first silicon layer is provided and connectable to ground.

39. The method of claim 37, wherein providing the phase-changeable layer comprises providing the phase-changeable layer as an indium selenide layer.

40. A re-recordable data storage medium constructed by performing a method comprising:
providing a first silicon layer of a re-recordable data storage medium having a semiconductor type selected from p-type and n-type;
providing a second silicon layer over the first silicon layer having a semiconductor type opposite to the semiconductor type of the first silicon layer;
providing an indium selenide layer over the second silicon layer having a crystalline phase corresponding to a first storable logical value and an amorphous phase corresponding to a second storable logical value, the layer having a semiconductor type identical to the semiconductor type of the first silicon layer; and,
providing a top electrode partially over the indium selenide layer and connectable to a voltage source.

41. The medium of claim 40, further initially comprising providing a bottom electrode on which the first silicon layer is provided and connectable to ground.

42. A method comprising:
illuminating a beam on a phase-changeable layer of a re-recordable storage medium, the layer having a phase indicative of a stored logical value;
detecting current flowing through the re-recordable data storage medium at a top electrode partially covering the phase-changeable layer; and,
determining the stored logical value based on the current flowing through the re-recordable data storage medium as detected at the top electrode.

43. The method of claim 42, further initially comprising biasing the top electrode, the medium further having an intermediate layer and a substrate layer below the phase-changeable layer that together with the phase-changeable layer act as a transistor, the medium also having a bottom electrode below the substrate coupled to ground.

44. The method of claim 43, wherein biasing the top electrode comprises positively biasing the top electrode, the phase-changeable layer and the substrate layer both being n-type, and the intermediate layer being p-type.

45. The method of claim 42, wherein illuminating the beam comprises illuminating one of an electron beam and a laser beam.

46. The method of claim 42, wherein detecting the current flowing through the re-recordable data storage medium comprises detecting the current as one of substantially a first current corresponding to a first phase of the phase-changeable layer indicating a first stored logical value, and a second current corresponding to a second phase of the phase-changeable layer indicating a second stored logical value.

47. The method of claim 46, wherein determining the stored logical value comprises determining the stored logical value as the first stored logical value based on detecting the first current, and as the second stored logical value based on detecting the second current.

48. A mass-storage device comprising:
a first mechanism receptive to a re-recordable data storage medium having a plurality of layers including a phase-changeable layer having a plurality of sub-portions, each sub-portion having a phase indicative of a stored logical value, the plurality of layers acting as a transistor;
an array of beam generators corresponding to the plurality of sub-portions of the medium, each beam generator capable of generating an illuminating beam at a first level to induce current flow through the corresponding sub-portion of the medium; and,
a second mechanism to detect the current flow induced through a currently illuminated sub-portion of the medium and to correlate the current flow detected with the stored logical value of the currently illuminated sub-portion.

49. The device of claim 48, further comprising a voltage source connectable to a top electrode for each sub-portion of the phase-changeable layer to bias the medium, the second mechanism detecting the current flow induced through the currently illuminated sub-portion of the medium at the top electrode for the currently illuminated sub-portion.

50. The device of claim 48, wherein the first mechanism is grounded, such that a bottom electrode of the re-recordable data storage medium becomes grounded.

51. The device of claim 48, wherein each beam generator is further capable of generating the illuminating beam at a second level to change the phase of a corresponding subportion of the medium, the device further comprising a controller to write a desired logical value to a selected sub-portion of the medium by controlling the beam generator corresponding to the selected sub-portion to illuminate the selected sub-portion at the second level.

52. The device of claim 48, wherein the array of beam generators comprises a field array of one of e-beam generators and laser beam generators.

53. The device of claim 48, wherein the second mechanism comprises a detector to detect the current flow induced through the currently illuminated sub-portion of the medium and an evaluator to correlate the current flow detected with the stored logical value of the currently illuminated sub-portion.

* * * * *